June 18, 1968 G. G. SCHOENFELD 3,389,270
SEMICONDUCTOR SWITCHING CIRCUIT
Filed Aug. 4, 1965
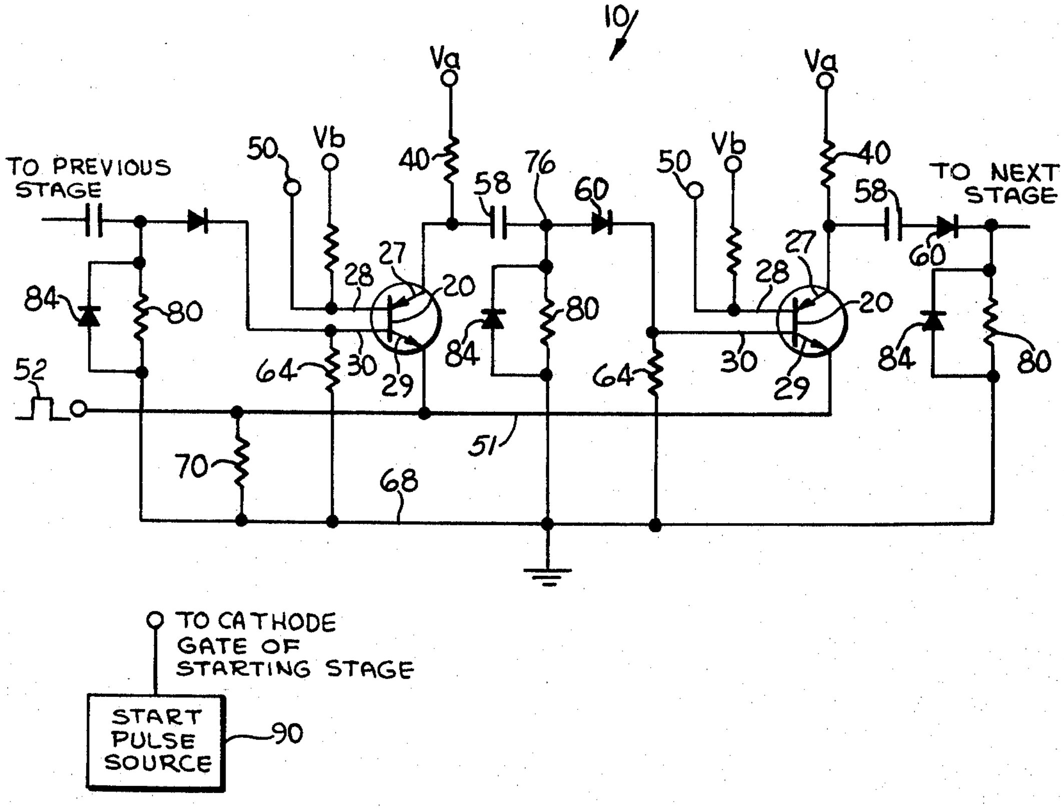
INVENTOR
GERHARD G. SCHOENFELD
BY Robert A. Green
ATTORNEY United States Patent Office 3,389,270

Patented June 18, 1968

3,389,270

SEMICONDUCTOR SWITCHING CIRCUIT

Gerhard G. Schoenfeld, Berkeley Heights, N.J., assignor to Burroughs Corporation, Detroit, Mich., a corporation of Michigan Filed Aug. 4, 1965, Ser. No. 477,246
6 Claims. (Cl. 307—225)

ABSTRACT OF THE DISCLOSURE

The disclosure is of a multiple stage counter circuit including a plurality of four-electrode semiconductor devices, each device including anode, anode gate, cathode, and cathode gate electrodes. The anode is used to couple signals through a capacitor from one stage to the cathode gate of the next stage. Input counting pulses are applied to the cathodes of the counting devices, and each input pulse turns off a device which is on and thereby causes a positive pulse to be coupled from the anode of the turned off device to the cathode gate of the next device which is thus turned on.

This invention relates to semiconductor switching circuits and an arrangement for increasing the speed of operation of such circuits which use multiple-junction, four-electrode semiconductor devices.

One type of multiple-junction semiconductor device now used to perform a switching function includes four operating electrodes and is known as a silicon controlled switch. The device includes, as its electrodes, anode, anode gate, cathode, and cathode gate. These devices are used in counter circuits in which the devices are connected in series and each device in the series performs a count-registering operation. These circuits are generally satisfactory; however, it is always desirable to be able to increase the frequency at which a circuit operates and to increase the range of supply voltage over which it operates reliably.

Accordingly, the objects of the invention relate to the provision of an improved semiconductor switching circuit capable of operating reliably at relatively high speeds and over a relatively wide voltage supply range.

Briefly, a circuit embodying the invention includes a semiconductor device which comprises four electrodes consisting of cathode, cathode gate, anode, and anode gate. In such a device the cathode gate is operated as the input electrode, and the anode gate is operated as the output electrode. According to the invention, a coupling circuit is provided between the devices in a counter so that time delays due to circuit components are minimized and operational speed is increased and the range of supply voltage over which reliable operation is achieved is also increased.

The invention is described in greater detail by reference to the drawing wherein the single figure is a schematic representation of a counter circuit embodying the invention.

The circuit 10 shown in the drawing includes two stages of a multiple-stage counting circuit in which four electrode semiconductor devices 20 are used as counting or switching elements. The devices 20 are known as silicon controlled switches or SCS devices, and the four electrodes include anode 27, anode gate 28, cathode 29, and cathode gate 30, with the cathode gate 30 generally operated as the input electrode and the anode gate 28 operated as the output electrode.

In the circuit 10 and in each device 20, the anode 27 is coupled through a bias resistor 40 to a positive D.C. bias power source V*a*. The anode gate 28 is connected through a resistive path to a positive D.C. bias power source V*b*, and it is also provided with a terminal 50, by means of which it can be coupled to a suitable utilization device, for example, a cathode glow numeral in a 6844A indicator tube (not shown). The cathode electrode 29 of each device 20 is connected to a bus 51 which is connected to a source of positive counting pulses 52.

According to the invention, the coupling circuit between devices 20 includes a connection from the anode 27 through a capacitor 58 and a diode 60, oriented as shown, to the cathode gate of the next leading device 20. Each cathode gate is also connected through a bias resistor 64 to a bus 68 which is connected to a source of reference voltage such as ground. The bus 51 is also connected to bus 68 by a resistive path 70. The coupling circuit also includes a connection from the junction 76 of capacitor 58 and the anode of diode 60 through a resistor 80 and diode 84 in parallel to ground. The parallel diode 84 has its anode connected to ground and its cathode connected to junction point 76 as shown.

In operation of the circuit 10, to start the counting operation, a positive pulse is applied from a suitable source 90 to the cathode gate 30 of the first SCS device in the counting chain, and the first device switches on.

The counting operation proceeds under the control of applied pulses 52. When a positive pulse 52 is applied to line 51 and thus to the cathode electrodes 29 of the devices 20, the device 20 which is on is turned off and the capacitor in the anode circuit, which had been at ground potential, charges up to the potential of V*a* through resistor 40. As the capacitor 58 charges, it applies a positive pulse to the cathode gate 30 of the next SCS device 20, which thus turns on and registers a count. Each positive pulse 52 thus turns off the device which is on, and this in turn causes the next adjacent device which was off to turn on.

Thus, it can be seen that, as each device is turned on and off, its anode goes positive and then negative. The positive portion of the pulse passes through to the next device; however, the negative portion of the pulse (without diode 84) must dissipate through resistor 80. As the frequency of counting increases, without diode 84, a negative potential would tend to build up at point 76, and it would become increasingly difficult to transmit the positive counting pulse from one device to the next. The diode 84 serves to lead the negative portion of each counting pulse to ground, with the result that the frequency of operation may be as high as the megacycle range, whereas, without the diode 84, the frequency is between 100 and 200 kc. per second. In addition, reliable counting is achieved with supply voltage V*a* being in the range of about 10 to about 20 volts, whereas in the prior art, a voltage range of only about 10 to 14 volts was permissible.

What is claimed is:

1. An electronic circuit module for performing counting and storage operations comprising:

a plurality of four-electrode semiconductor devices each including an anode electrode, an anode gate electrode, a cathode electrode, and a cathode gate electrode, each anode electrode being operable as an output electrode and being adapted to be coupled to the cathode gate electrode of a next adjacent device in the counting series to couple counting pulses thereto, the cathode gate electrode comprising an input electrode, means coupling each cathode electrode to a common source of input pulses, means coupled to each anode gate electrode for connection to a utilization device, a coupling circuit coupled to the anode electrode of each said device and to the cathode gate electrode of a succeeding device, and circuit means including a diode connected between said coupling circuit and ground and oriented to couple signals of one polarity to ground and thereby facilitating the transfer of counting pulses of the opposite polarity from one device to the next.

2. An electronic circuit module for performing counting and storage operations comprising:

a plurality of four-electrode semiconductor devices each including an anode electrode, an anode gate electrode, a cathode electrode, and a cathode gate electrode, said anode electrode being operable as an output electrode and being adapted to be coupled to the cathode gate electrode of a second device to couple counting pulses thereto, the cathode gate electrode comprising an input electrode, means coupling each cathode electrode to a common source of input pulses, means coupled to each anode gate electrode for connection to a utilization device, a coupling circuit coupled to the anode electrode of each said device and to the cathode gate electrode of a succeeding device, and circuit means including a diode connected between said coupling circuit and ground for coupling negative signals to ground and facilitating the transfer of positive counting pulses from one device to the next.

3. The circuit defined in claim 2 wherein said coupling circuit includes a capacitor and diode in series and oriented to transmit positive pulses therethrough.

4. An electronic counter circuit for performing signal counting and storage operations comprising:

a plurality of four-electrode semiconductor devices connected in a series, each device including an anode electrode, an anode gate electrode, a cathode electrode, and a cathode gate electrode, said anode electrodes comprising output electrodes and said cathode gate electrodes comprising input electrodes, means coupling each cathode electrode to a common source of input pulses, means coupled to each anode gate electrode for connection to a utilization device, a coupling circuit connecting the anode electrode of each device to the cathode gate electrode of the next device in the series, and an auxiliary circuit including a resistor and diode in parallel connected between said coupling circuit and ground and oriented to couple pulses of one polarity to ground and thereby facilitating the transmission of pulses of the opposite polarity from one device to the next.

5. An electronic counter circuit for performing signal counting and storage operations comprising:

a plurality of four-electrode semiconductor devices connected in a series, each device including an anode electrode, an anode gate electrode, a cathode electrode, and a cathode gate electrode, said anode electrodes comprising output electrodes and said cathode gate electrodes comprising input electrodes, means coupling each cathode electrode to a common source of input pulses, means coupled to each anode gate electrode for connection to a utilization device, a coupling circuit connecting the anode electrode of each device to the cathode gate electrode of the next device in the series, said coupling circuit including a capacitor and a diode in series and oriented to transmit positive pulses from said each device to the next, and an auxiliary circuit including a resistor and diode in parallel connected between said coupling circuit and ground and oriented to couple pulses of one polarity to ground and thereby facilitating the transmission of pulses of the opposite polarity from one device to the next.

6. An electronic counter circuit for performing signal counting and storage operations comprising:

a plurality of four-electrode semiconductor devices connected in a series, each device including an anode electrode, an anode gate electrode, a cathode electrode, and a cathode gate electrode, said anode electrodes comprising output electrodes and said cathode gate electrodes comprising input electrodes, means coupling each cathode electrode to a common source of input pulses, means coupled to each anode gate electrode for connection to a utilization device, a coupling circuit connecting the anode electrode of each device to the cathode gate electrode of the next device in the series, said coupling circuit including a capacitor and a diode in series and oriented to transmit positive pulses from said each device to the next, and an auxiliary circuit including a resistor and diode in parallel connected between said coupling circuit and ground and oriented to couple negative pulses to ground.

References Cited

UNITED STATES PATENTS

| | | | |
|---|---|---|---|
| 3,207,916 | 9/1965 | Slow | 307—88.5 |
| 3,294,985 | 12/1966 | Kramasz | 307—88.5 |

OTHER REFERENCES

Solid State Design Application Note, Dynaquad 100 KC N–BIT Shift Register," February 1962, pp. 43 and 45, 307–88.5/21.5.

EEE, "Four Terminal Switches From NPN and PNP Planars," by D. S. Paterson et al., April 1963, pp. 72–74, 307–88.5/21.5.

ARTHUR GAUSS, *Primary Examiner.*

J. ZAZWORSKY, *Assistant Examiner.*